United States Patent
Subrahmanyam et al.

(10) Patent No.: US 6,284,613 B1
(45) Date of Patent: Sep. 4, 2001

(54) METHOD FOR FORMING A T-GATE FOR BETTER SALICIDATION

(75) Inventors: Chivukula Subrahmanyam; Yelehanka Ramachandramurthy Pradeep; Ramakrishnan Rajagopal, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/434,920

(22) Filed: Nov. 5, 1999

(51) Int. Cl.$^7$ ................................................. H01L 21/336
(52) U.S. Cl. ........................ 438/307; 438/299; 438/585; 438/592
(58) Field of Search ..................................... 438/307, 305, 438/299, 301, 306, 585, 592, 579, 574

(56) References Cited

U.S. PATENT DOCUMENTS

| | | | |
|---|---|---|---|
| 5,496,779 | 3/1996 | Lee et al. | 437/40 |
| 5,498,560 | 3/1996 | Sharma et al. | 437/43 |
| 5,543,253 | 8/1996 | Park et al. | 439/5 |
| 5,658,826 | 8/1997 | Chung | 438/570 |
| 5,688,704 | 11/1997 | Liu | 437/41 |
| 5,858,843 | * 1/1999 | Doyle et al. | 438/299 |
| 5,861,327 | 1/1999 | Maeng et al. | 438/167 |
| 5,891,783 | * 4/1999 | Lin et al. | 438/307 |
| 5,937,299 | * 8/1999 | Michael et al. | 438/592 |
| 5,998,285 | * 12/1999 | Chou | 438/585 |
| 6,087,248 | * 7/2000 | Rodder | 438/592 |
| 6,117,741 | * 9/2000 | Chatterjee et al. | 438/585 |

FOREIGN PATENT DOCUMENTS 8-162634 * 6/1996 (JP) .

* cited by examiner

Primary Examiner—Michael Trinh
(74) Attorney, Agent, or Firm—George O. Saile; Rosemary L. S. Pike; William J. Stoffel

(57) ABSTRACT

A method for a T-gate and salicide process that allows narrow bottom gate widths below 0.25 μm and wide top gate widths to allow silicide gate contacts on the top of the T-gate. A dummy gate composed of an insulating material is formed over the substrate. Then we form LDD regions adjacent to the dummy gate preferably by ion implanting f (I/I) impurity ions into the substrate using the dummy gate as a mask. A pad oxide layer and dielectric layer are formed over the substrate surface. The dielectric layer over the dummy gate is removed preferably by a CMP process. We then remove the dummy gate to form a gate opening exposing the substrate surface. A gate dielectric layer is formed over the substrate surface in the gate opening. We form a polysilicon layer over the dielectric layer and the substrate surface in the gate opening. The polysilicon layer is patterned to form a T-gate. The dielectric layer is removed. We forming source/drain (S/D) regions adjacent to the T-gate by an Ion implant process. A silicide layer is formed over the T-gate and the substrate to form silicide contacts to the SID regions and gate contacts to the T-gate. Then we form a dielectric layer (ILD) over the T-gate and substrate. We form contact opening through the dielectric layer to expose the S/D regions and T-gate. We form contacts to the S/D regions and to the T-gate.

10 Claims, 3 Drawing Sheets

US 6,284,613 B1

METHOD FOR FORMING A T-GATE FOR BETTER SALICIDATION

BACKGROUND OF INVENTION

1) Field of the Invention

This invention relates generally to fabrication of gate electrodes for semiconductor devices and more particularly to the fabrication of a T-shaped gate electrode for an MOS semiconductor device.

2) Description of the Prior Art

As devices are made smaller, a major problem with semiconductor manufacturing is the forming of smaller gate length or widths while maintaining gate performance and forming proper low resistance silicide contacts. The gate must be narrow at the substrate to reduce the channel length but must be wide enough so that proper salicide contacts can be formed to the top of the gate. This is particularly important as gate width (or lenghts decrease below 0.25 $\mu$m). In order to increase the operation frequency of a device, it is in general required to shorten a length of a gate. However, further shortening of the gate length which is about 1 $\mu$m causes gate resistance to increase due to a smaller aspect ratio. Therefore, in order to prevent increase of the gate resistance while shortening the gate length further, a method in which a section of the gate is formed to have a T form is mostly used.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,543,253(Park et al.) shows a T-gate process using one mask.

U.S. Pat. No. 5,688,704(Liu) shows a T-gate using 2 dielectric layers.

U.S. Pat. No. 5,861,327(Maeng et al.) teaches a T-gate using electroplating.

U.S. Pat. No. 5,658,826(Chung), U.S. Pat. No. 5,496,779 (Lee et al.) and U.S. Pat. No. 5,498,560(Sharma et al.) show T-gates using other processes.

However, an improved process is need for a T-gate electrode.

SUMMARY OF THE INVENTION

It is an object of the present invention to provide a method for fabricating a t-shaped gate electrode.

It is an object of the present invention to provide a method for fabricating a t-shaped gate electrode that allows proper salicidation on the Top of the gate and allows gate bottom dimensions below 0.25 $\mu$m.

To accomplish the above objectives, the present invention provides a method of manufacturing a T-shaped gate electrode which is characterized as follows. A dummy gate composed of an insulating material is formed over the substrate. Then we form LDD regions adjacent to the dummy gate preferably by ion implanting (I/I) impurity ions into the substrate using the dummy gate as a mask. A pad oxide layer and dielectric layer are formed over the substrate surface. The dielectric layer over the dummy gate is removed preferably by a CMP process. We then remove the dummy gate to form a gate opening exposing the substrate surface. A gate dielectric layer is formed over the substrate surface in the gate opening. We form a polysilicon layer over the dielectric layer and the substrate surface in the gate opening. The polysilicon layer is patterned to form a T-gate. The dielectric layer is removed leaving the T-gate over the substrate. We forming source/drain (S/D) regions adjacent to the T-gate by an Ion implant process. A silicide layer is formed over the T-gate and the substrate to form silicide contacts to the S/D regions and gate contacts to the T-gate. We form a dielectric layer (ILD) over the T-gate and substrate. We form contact opening through the dielectric layer to expose the S/D regions and T-gate. We form contacts to the S/D regions and to the T-gate.

It is a major advantage of the invention's T-gate that the top gate 40T is wide to allow the silicide to form property. If a conventional straight gate was used, the top of the gate would be too narrow to properly allow the silicide to form properly. The invention's T-gate allows the gate bottom 40B to be made narrow (>0.25 $\mu$m) while the gate top 40T is wider (e.g., >0.25) to allow a good silicide contact to allow a denser faster circuit. The invention avoids the poly gate line widening at the end of the gate contact.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention provides a method of forming a T-gate and salicide process.

Figure 1:
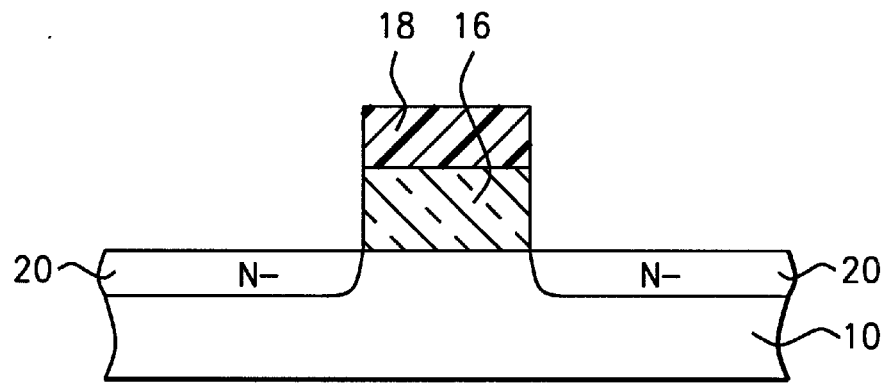
FIGS. 1 through 8 are cross sectional views for illustrating a method for manufacturing a T-shaped gate according to the present invention.

Referring to FIG. 1, an insulating layer 16 is formed over the substrate. The substrate can be any semiconductor substrate such as a silicon substrate or a SOI substrate.

The insulating layer 16 is preferably comprised of silicon oxide, silicon oxynitride, doped oxide or silicon nitride and is most preferably composed of $SiO_2$. The insulating layer 16 preferably has a thickness of between about 1000 and 3500 Å.

Still referring to FIG. 1, we next form a dummy gate resist pattern 18 over the insulating layer. A photoresist layer can be formed (e.g., spun on) and then exposed using a first gate optical mask (or dummy gate optical mask). The resist layer is then developed to form the dummy gate resist pattern 18. This same optical mask can be used later in the process to pattern the T-gate. See FIG. 4. The resist can be either positive or negative resist.

The insulating layer is patterned to form a dummy gate 16 over the substrate 10. The dummy gate preferably has a width of between about 0.1 and 0.35 $\mu$m.

Then, the dummy gate resist pattern 18 is removed.

Then we form LDD regions 20 adjacent to the dummy gate 16 preferably by I/I impurity ions into the substrate using the dummy gate 16 as a mask.

Figure 2:
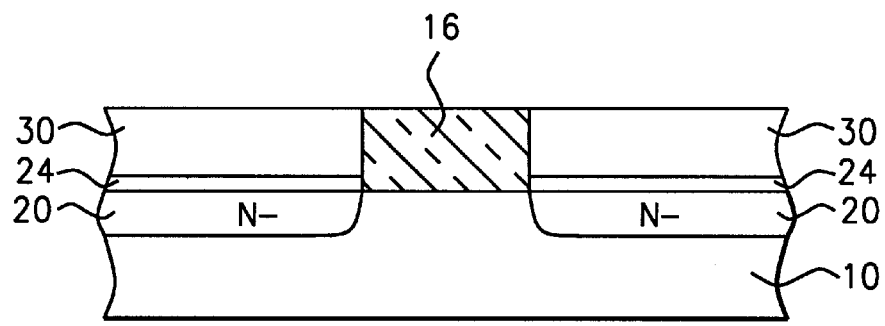

As shown in FIG. 2, a pad oxide layer 24 is formed over the substrate surface.

Next, we form a dielectric layer 30 over the pad oxide layer 24 and the dummy gate 16. The dielectric layer is can be comprised of silicon nitride, silicon oxynitride or silicon oxide and is most preferably composed of silicon nitride (SiN). The layer 30 preferably has a thickness of between about 1000 and 4000 Å.

The dielectric layer 30 is then removed from over the dummy gate 16 preferably by a chemical-mechanical polish step.

Figure 3:
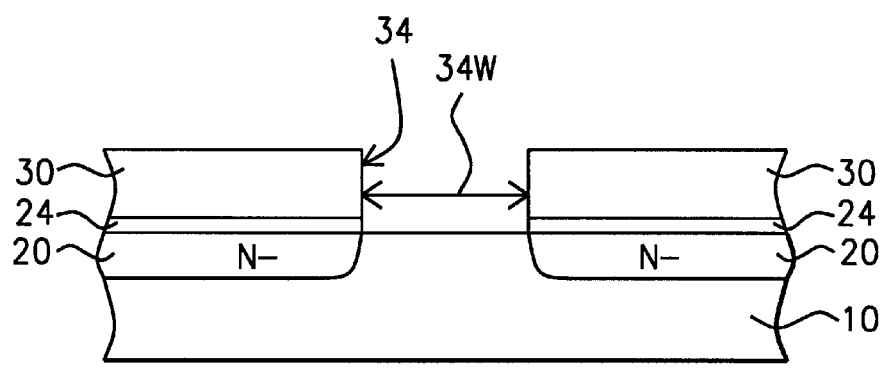

As shown in FIG. 3, We then remove the dummy gate 16 to form a gate opening 34 exposing the substrate surface. The gate opening 34 has a width 34W of between about 0.1 and 0.35 $\mu$m and more preferably between 0.1 and 0.25 $\mu$m.

A gate dielectric layer 38 is formed over the substrate surface in the gate opening 34. The gate dielectric layer 38 is preferably a gate oxide layer having a thickness of between about 10 and 80 Å.

Figure 4:
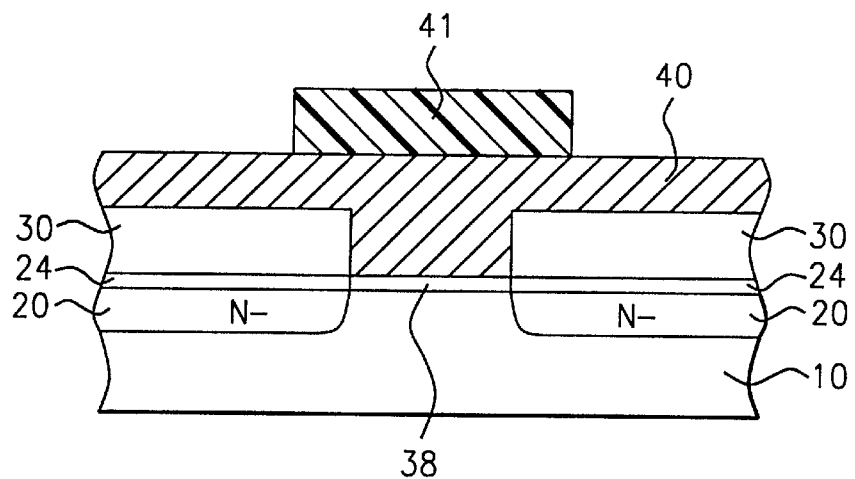

Still referring to FIG. 4, we form a gate layer 40 (e.g., polysilicon layer) over the dielectric layer and the substrate surface in the gate opening. The gate layer can also be comprised of only a polysilicon layer or polysilicon under a polycide layer such as tungsten silicide ($WSi_2$), titanium silicide ($TiSi_2$) or cobalt silicide ($CoSi_2$). The gate layer 40 is most preferably comprised of polysilicon.

The gate (polysilicon) layer 40 is patterned (using an oversized poly resist mask) to form a T-gate. A T-gate resist pattern 41 is formed over the poly layer. The T-gate is comprised of a gate bottom 40B (see FIG. 6) filling the gate opening 34 and gate top 40T extending laterally over a portion of the dielectric layer. The oversized poly resist mask is preferably between 60 and 100% oversized of the bottom poly mask 18. That is the T-gate resist pattern 41 is preferably between 60 and 100% as large as the dummy gate resist pattern 18.

The T-gate resist pattern 41 can be exposed using the first gate optical mask (or dummy gate optical mask) (used to expose the dummy gate resist mask 18—See FIG. 1). A photoresist is overexposed or under exposed using the same first gate optical mask to form the larger T-gate resist pattern 41 that is larger than the dummy gate resist pattern 18.

Figure 6:
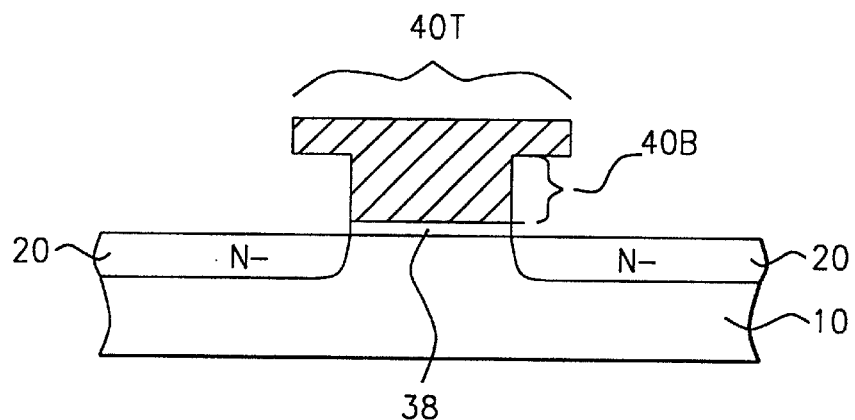

Referring to FIG. 6, the dielectric layer is removed leaving the T-gate over the substrate.

Figure 5:
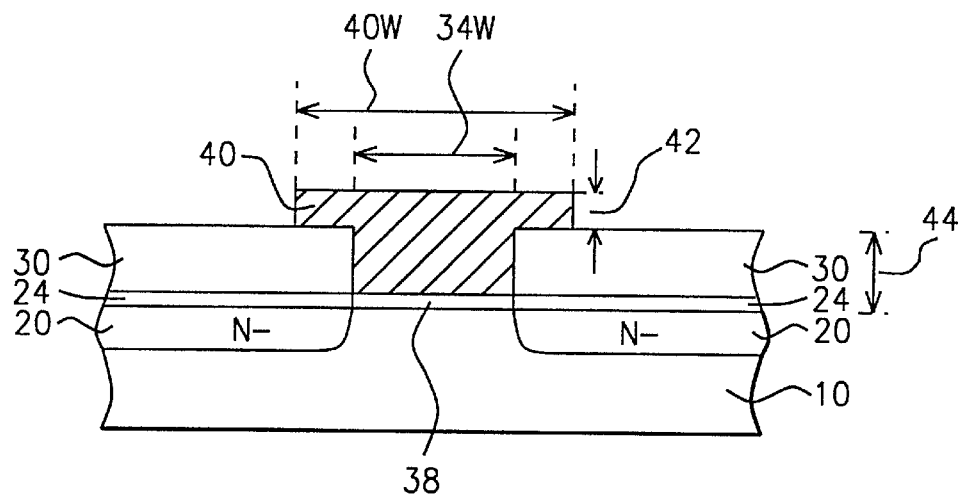

The T-gate 40 has gate top 40T with a top width 40W of between about 0.25 $\mu$m and 0.50 $\mu$m and more preferably between 0.35 and 0.5 $\mu$m and a top height 42 between 500 and 1000 Å; and a gate bottom with a bottom width 34W (See FIG. 3) between 0.1 and 0.35 $\mu$m and more preferably between 0.1 and 0.25 $\mu$m; and a bottom height 44 (See FIG. 5) between 1500 and 3500 Å.

Figure 7:
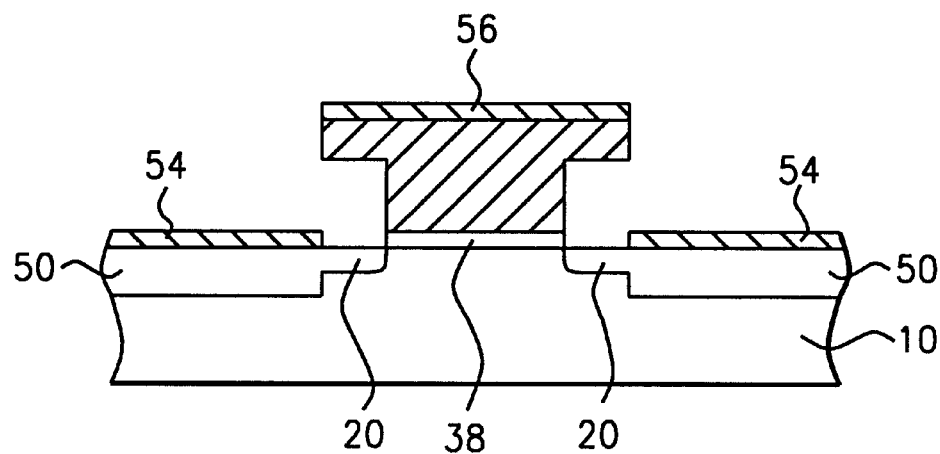

Referring to FIG. 7, we form source/drain (S/D) regions 50 adjacent to the T-gate 40 by an Ion implant process. Optionally, a resist pattern can be formed over the t-gate 40 to act as an implant mask. The gate 40 and isolation regions (not shown) act as implant masks. The T gate separates the S/D regions 50 from the LLD regions 20 because the overhang portion of the Top gate 40T shields the substrate thereunder.

As shown in FIG. 7, a silicide layer is formed over the T-gate and the substrate to form silicide contacts 54 to the S/D regions 50 and gate contacts 56 to the T-gate. This is called a salicide process (Self Aligned silicide). This can be accomplished by forming a metal layer over the substrate and gate surface and annealing the metal layer to form a metal silicide. It is a major advantage of the invention's T-gate 40 that the top gate 40T is wide to allow the silicide to form properly. If a conventional straight gate was used, the top of the gate would be too narrow to properly allow the silicide to form property. The invention's T-gate allows the gate bottom 40B to be made narrow (>0.25 $\mu$m) to allow a denser circuit.

Figure 8:
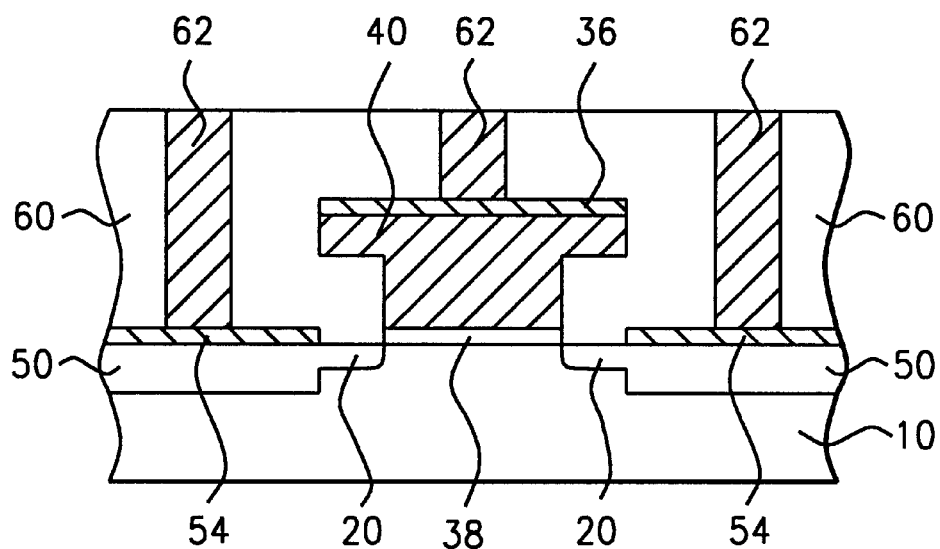

As shown in FIG. 8, we form a ILD dielectric layer (ILD) 60 over the T-gate 40 and substrate 10. The interlevel dielectric (ILD) layer is preferably composed of silicon oxide and preferably has a thickness of between about 1000 and 12,000 Å.

As show in FIG. 8, We form contact opening through the dielectric layer 60 to expose the S/D regions 50 and T-gate 40.

Then, we form contacts 62 to the S/D regions 50 and to the T-gate 40. The contacts are preferably composed a conductive material such as W or polysilicon.

As to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor, reference to a "plasma" includes a gas or gas reactants activated by an RF glow discharge, reference to "the contact material" includes aluminum, aluminum alloys, and other conductive materials which have a melting point enabling them to be sputtered over the temperature range described herein.

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention. Also, the flow rates in the specification can be scaled up or down keeping the same molar % or ratios to accommodate difference sized reactors as is known to those skilled in the art.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of forming a T-gate used with a salicide process for a semiconductor devices, comprising the steps of:
   a) patterning an insulating layer to form a dummy gate over a substrate; said substrate having a substrate surface;
      said insulation layer is patterned by forming a dummy gate resist pattern over said insulating layer using a first gate optical mask; said dummy gate resist pattern is exposed using said first optical mask, and etching said insulating layer using said dummy gate resist pattern as an etch mask;

b) forming LDD regions adjacent to said dummy gate by ion implanting (I/I) impurity ions into said substrate using said dummy gate as a mask;

c) forming a pad oxide layer over said substrate surface;

d) forming a dielectric layer over said pad oxide layer and said dummy gate and removing said dielectric layer from over said dummy gate;

e) removing said dummy gate forming a gate opening exposing said substrate surface;

f) forming a gate dielectric layer over said substrate surface in said gate opening;

g) forming a gate layer over said dielectric layer and said substrate surface in said gate opening;

h) patterning said gate layer to form a T-gate; said T-gate filling said gate opening and extending laterally over a portion of said dielectric layer;

said gate layer is patterned by using a T-gate resist pattern formed by using said first gate optical mask by over exposing a resist layer through said first optical gate mask so that the T-gate resist pattern is between 60% and 100% wider than said dummy gate resist; and i) removing said dielectric layer and said pad oxide layer leaving said T-gate over said substrate.

2. The method of claim 1 which further includes at the end the following steps:

a) forming source/drain (S/D) regions adjacent to said T-gate by an Ion implant process;

b) forming a silicide layer over said T-gate and said substrate to form silicide contacts to the source/drain (S/D) regions and gate contacts to the T-gate;

c) forming an interlevel dielectric layer over the T-gate and substrate;

d) forming contact opening through said interlevel dielectric layer to expose said source/drain (S/D) regions and T-gate; and e) forming contacts to said source/drain (S/D) regions and to said T-gate.

3. The method of claim 1 wherein said insulating layer is comprised of silicon oxide.

4. The method of claim 1 wherein said dummy gate has a width of between about 0.1 and 0.35 $\mu$m.

5. The method of claim 1 wherein said dielectric layer comprised of silicon nitride.

6. The method of claim 1 wherein said gate opening having a width of between about 0.1 and 0.25 $\mu$m.

7. The method of claim 1 wherein said T-gate having a gate top with a top width of between about 0.25 and 0.5 $\mu$m and a top height between 500 and 2000 Å; and a bottom width between 0.1 and 0.35 $\mu$m; and a bottom height between 1500 and 3500 Å.

8. The method of claim 1 wherein said T-gate having a gate top with a top width of between about 0.35 and 0.5 $\mu$m and a top height between 500 and 2000 Å; and a bottom width between 0.1 and 0.25 $\mu$m; and a bottom height between 1500 and 3500 Å.

9. The method of claim 1 wherein said gate layer is comprised of polysilicon.

10. A method of forming a T-gate and using a salicide process; comprising the steps of:

a) forming an insulating layer over a substrate;

b) forming a dummy gate resist pattern over said insulating layer using a first gate optical mask;

c) patterning said insulating layer to form a dummy gate over said substrate;

said substrate having a substrate surface;

d) removing said gate resist pattern;

e) forming LDD regions adjacent to said dummy gate by ion implanting (I/I) impurity ions into said substrate using said dummy gate as a mask;

f) forming a pad oxide layer over said substrate surface;

g) forming a dielectric layer over said pad oxide layer and said dummy gate and removing said dielectric layer from over said dummy gate;

h) removing said dummy gate forming a gate opening exposing said substrate surface;

i) forming a gate dielectric layer over said substrate surface in said gate opening; said gate opening having a width of between about 0.1 and 0.35 $\mu$m.

j) forming a gate layer over said dielectric layer and said substrate surface in said gate opening;

said gate layer is comprised of polysilicon;

k) patterning said gate layer to form a T-gate by forming a T-gate resist pattern and etching said gate layer; said T-gate filling said gate opening and extending laterally over a portion of said dielectric layer;

said gate layer is pattern using a T-gate resist pattern that is formed by exposing a resist layer using said first gate optical mask;

said T-gate resist pattern is between 60% and 100% wider than said dummy gate resist pattern and where said T-gate resist pattern is formed by overexposing a resist layer thorough said first gate optical mask;

said T-gate has a gate top with a top width of between about 0.35 and 0.5 $\mu$m and a top height between 500 and 2000 Å; and a bottom width between 0.1 and 0.35 $\mu$m; and a bottom height between 1500 and 3500 Å;

l) removing said dielectric layer and said pad oxide layer leaving said T-gate over said substrate;

m) forming source/drain (S/D) regions adjacent to said T-gate by an Ion implant process;

n) forming a silicide layer over said T-gate and said substrate; to form silicide contacts to said source/drain (S/D) regions and gate contacts to the T-gate;

o) forming a dielectric layer over the T-gate and substrate;

p) forming contact opening through said dielectric layer to expose said source/drain regions and T-gate; and q) forming contacts to said source/drain regions and to said T-gate.

* * * * *